United States Patent
Koike et al.

(10) Patent No.: US 8,895,978 B2
(45) Date of Patent: Nov. 25, 2014

(54) SEMICONDUCTOR DEVICE

(75) Inventors: Junichi Koike, Sendai (JP); Pilsang Yun, Sendai (JP); Hideaki Kawakami, Chiba (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 0 days.

(21) Appl. No.: 13/807,901

(22) PCT Filed: Jun. 30, 2011

(86) PCT No.: PCT/JP2011/065525
§ 371 (c)(1),
(2), (4) Date: Feb. 20, 2013

(87) PCT Pub. No.: WO2012/002573
PCT Pub. Date: Jan. 5, 2012

(65) Prior Publication Data
US 2013/0168671 A1 Jul. 4, 2013

(30) Foreign Application Priority Data
Jul. 2, 2010 (JP) .................................. 2010-152113

(51) Int. Cl.
| H01L 29/10 | (2006.01) |
| H01L 29/45 | (2006.01) |
| H01L 29/786 | (2006.01) |
| H01L 29/417 | (2006.01) |
| H01L 33/40 | (2010.01) |
| H01L 33/26 | (2010.01) |

(52) U.S. Cl.
CPC .............. *H01L 29/417* (2013.01); *H01L 33/40* (2013.01); *H01L 33/26* (2013.01); *H01L 29/45* (2013.01); *H01L 29/7869* (2013.01); *H01L 29/78618* (2013.01)
USPC .............................................. 257/43; 257/57

(58) Field of Classification Search
USPC .................................................. 257/43, 59, 57
See application file for complete search history.

(56) References Cited

U.S. PATENT DOCUMENTS

| 7,626,665 B2 | 12/2009 | Koike |
| 2005/0218519 A1 | 10/2005 | Koike et al. |
| 2006/0108636 A1* | 5/2006 | Sano et al. .................... 257/347 |
| 2008/0197350 A1* | 8/2008 | Park et al. ........................ 257/43 |

(Continued)

FOREIGN PATENT DOCUMENTS

| JP | 2002-69550 A | 3/2002 |
| JP | 3302894 B2 | 7/2002 |

(Continued)

OTHER PUBLICATIONS

P.S. Yun et al., "Microstructure analysis of the reaction interface of Cu—Mn/In—Ga—Zn—O films", The 37th Spring Meeting, 2010; The Japan Society of Applied Physics and Related Societies (Mar. 17 to Mar. 20, 2010), Presentation No. 17a-TL-4.

*Primary Examiner* — Matthew W Such
*Assistant Examiner* — Frederick B Hargrove
(74) *Attorney, Agent, or Firm* — Sughrue Mion, PLLC

(57) ABSTRACT

An ohmic contact between an electrode and a semiconductor layer is more stably formed and an electrical contact resistance between them is further reduced.

A semiconductor device comprises a semiconductor layer 103 composed of an oxide semiconductor material containing indium, an ohmic electrode 107 provided on the semiconductor layer 103 and having an ohmic contact with the semiconductor layer 103, and an intermediate layer 106 provided between the semiconductor layer 103 and the ohmic electrode 107, wherein the intermediate layer 106 includes a first region 106a whose indium atomic concentration is greater than that of an interior of the semiconductor layer 103 and a second region 106b whose indium atomic concentration is less than that of the first region.

11 Claims, 10 Drawing Sheets

(56) References Cited

U.S. PATENT DOCUMENTS

| | | | |
|---|---|---|---|
| 2010/0025679 A1* | 2/2010 | Yamazaki et al. | 257/43 |
| 2010/0117074 A1* | 5/2010 | Yamazaki et al. | 257/43 |
| 2010/0117075 A1 | 5/2010 | Akimoto et al. | |
| 2011/0121289 A1* | 5/2011 | Miyanaga et al. | 257/43 |

FOREIGN PATENT DOCUMENTS

| | | |
|---|---|---|
| JP | 2004-91907 A | 3/2004 |
| JP | 2004-163901 A | 6/2004 |
| JP | 2005-158887 A | 6/2005 |
| JP | 2005-166757 A | 6/2005 |
| JP | 2005-277390 A | 10/2005 |
| JP | 2008-205469 A | 9/2008 |
| JP | 2010-3822 A | 1/2010 |
| JP | 2010-135770 A | 6/2010 |
| JP | 2011-49543 A | 3/2011 |
| JP | 2011-129897 A | 6/2011 |
| WO | 2006/025347 A | 3/2006 |

* cited by examiner

SEMICONDUCTOR DEVICE

TECHNICAL FIELD

This invention relates to a semiconductor device provided with an electrode that forms an ohmic contact with a semiconductor layer.

BACKGROUND ART

Electrically conductive oxide semiconductors have in recent years attracted attention as materials for forming optically transparent, transparent electrodes or the active (channel) layer of thin-film transistors (abbreviation: TFT) or other semiconductor devices. Thin-film transistors that utilize an oxide semiconductor as the active layer are being actively applied to flat panel display devices like liquid crystal display (abbreviation: LCD) devices and organic electro-luminescent (abbreviation: EL) devices. Moreover, transparent electrodes containing an oxide semiconductor as a component have been applied to flat display panels and other flat panel display devices, as well as to touch panels.

In these fields of industrial application of electrically conductive oxide semiconductors, in order to reduce the RC delay of signal transmission, ohmic electrodes composed of metal materials of high electrical conductivity and low electrical resistance are used for the interconnections and electrodes of the oxide semiconductor. The prior art uses, for example, aluminum (element symbol: Al), aluminum alloy, molybdenum (element symbol: Mo), and the like. Further, there have been proposed electrodes and interconnectors formed by laminating dissimilar metal layers of alloys of titanium (element symbol: Ti) or aluminum and silicon (element symbol: Si). Recently, moreover, a technique has been tried that forms an oxide semiconductor ohmic electrode from copper (element symbol: Cu), which has low electrical resistance.

For example, regarding a thin Film Transistor (abbreviation: TFT) used in a liquid crystal display device (abbreviation: LCD), technologies are available for using copper alloy to form the ohmic electrodes constituting a source electrode and a drain electrode, as well as interconnectors (see Patent document 1 to 7). In particular, Patent document 5 teaches that by using a copper alloy obtained by adding a suitable additive element to copper, oxidation of the copper is inhibited by a metallic oxide film formed by the additive element, so that ohmic electrodes of low electrical contact resistance and copper interconnectors of small RC delay are furnished.

It has been suggested that manganese (element symbol: Mn) is preferable as the additive element (see Patent document 5). Non-patent document 1 teaches a technique for forming a copper electrode on a thin-film transistor that uses an electrically conductive oxide semiconductor as an active (channel) layer. Specifically, copper-manganese (Cu—Mn) alloy is used when forming a copper electrode on a thin-film transistor using amorphous gallium oxide-indium-zinc (Ga—In—Zn—O) as the active layer.

PRIOR ART DOCUMENTS

Patent Documents

Patent document 1: Japanese unexamined patent publication 2005-166757
Patent document 2: Japanese unexamined patent publication 2002-69550
Patent document 3: Japanese unexamined patent publication 2005-158887
Patent document 4: Japanese unexamined patent publication 2004-91907
Patent document 5: WO 2006/025347A1
Patent document 6: Japanese Patent 3302894
Patent document 7: Japanese unexamined patent publication 2004-163901

Non-Patent Document

Non-patent document 1: P. S. Yun, J. Koike, The 37th Spring Meeting, 2010; The Japan Society of Applied Physics and Related Societies (March 17 to Mar. 20, 2010), Presentation No. 17a-TL-4, "Microstructure analysis of the reaction interface of Cu—Mn/In—Ga=Zn—O thin films"

Making the active layer of oxide semiconductor, whose electron mobility is about tenfold that of an amorphous silicon which is the constituent material of the active layer of a conventional thin-film transistor, would enable configuration of a thin-film transistor capable of high-speed operation. In addition, if it should be possible to stably form the ohmic electrodes and gate electrode of copper having low electrical resistance, it would be possible to enhance definition of flat displays.

However, the actual situation is that no technology has been adequately developed to stably form on an oxide semiconductor ohmic electrodes made of copper of low electrical contact resistance. The prior art has not yet thoroughly determined a copper ohmic electrode/oxide semiconductor layer interface contact structure which is for producing an ohmic electrode of low electrical contact resistance when a copper-manganese alloy, for example, is used to form a copper source electrode or a drain electrode on an oxide semiconductor active layer containing indium (element symbol: In), for example.

DISCLOSURE OF THE INVENTION

Problems to be Solved by the Invention

The present invention was made to solve the aforesaid problems of the prior art and has as its object to provide a semiconductor device wherein ohmic contact can be stably formed between an electrode and a semiconductor layer to enable still further reduction of electrical contact resistance therebetween.

Means for Solving the Problems

With regard to an electrically conductive oxide semiconductor layer, this invention i) presents a contact structure at the interface between a copper ohmic electrode and an oxide semiconductor layer, the copper ohmic electrode giving rise to an ohmic electrode made of copper and having low electrical contact resistance, and provides a semiconductor device furnished with an ohmic electrode having the contact structure.

Means (1) to (16) for achieving the object of the present invention are listed below.

(1) A semiconductor device comprising: a semiconductor layer composed of an oxide semiconductor material containing indium; an ohmic electrode provided on the semiconductor layer and having an ohmic contact with the semiconductor layer; and an intermediate layer provided between the semiconductor layer and the ohmic electrode, wherein the intermediate layer includes a first region whose indium atomic concentration is greater than that of an interior of the semiconductor layer and a second region whose indium atomic concentration is less than that of the first region.

(2) In (1), the semiconductor device wherein the first region is located in contact with the semiconductor layer and the second region is located in contact with the ohmic electrode.

(3) In (1) or (2), the semiconductor device wherein the first region is composed of crystal grains containing indium (In).

(4) In any of (1) to (3), the semiconductor device wherein the second region is composed of amorphous material.

(5) In any of (1) to (4), the semiconductor device wherein the thickness of the intermediate layer where the first region and the second region meet is 3 nm or more and 30 nm or less.

(6) In any of (1) to (5), the semiconductor device wherein the first and second regions are constituted to contain an oxide of a metal forming the ohmic electrode.

(7) In (6), the semiconductor device, wherein the metal forming the ohmic electrode is a metal with a free energy of oxide formation of a lower value than indium.

(8) In (6) or (7), the semiconductor device wherein the metal forming the ohmic electrode contains at least one among manganese (Mn), molybdenum (Mo), and titanium (Ti).

(9) In (8), the semiconductor device wherein the metal forming the ohmic electrode contains manganese.

(10) In (9), the semiconductor device wherein an electrovalence of the manganese increases from the second region toward the first region.

(11) In (9) or (10), the semiconductor device wherein an atomic concentration of the manganese exhibits maximum value in the second region and is lower in the first region than in the second region.

(12) In (8), the semiconductor device, wherein the metal forming the ohmic electrode contains titanium.

(13) In (12), the semiconductor device, wherein the electrovalence of the titanium increases from the second region toward the first region.

(14) In any of (1) to (13), the semiconductor device wherein oxygen concentrations of the first and second regions are lower than an oxygen concentration of the semiconductor layer.

(15) In any of (1) to (14), the semiconductor device wherein the ohmic electrode is formed of a copper alloy whose main constituent element is copper.

(16) In (15), the semiconductor device wherein the second region contains more copper than the first region.

Effect of the Invention

In the present invention, the intermediate layer is constituted to include the first region whose indium atomic concentration is greater than that of the interior of the semiconductor layer and the second region whose indium atomic concentration is less than that of the first region. An ohmic electrode of low electrical contact resistance can be obtained because the indium-concentrated first region acts as a high conductivity layer.

Further, since the second region of the intermediate layer is given a lower atomic concentration of indium than the first region, the second region exerts and effect of inhibiting intrusion into the electrode of indium that is a constituent of the oxide semiconductor layer, whereby an ohmic electrode of low electrical resistance containing substantially no indium can be stably formed.

Figure 1:
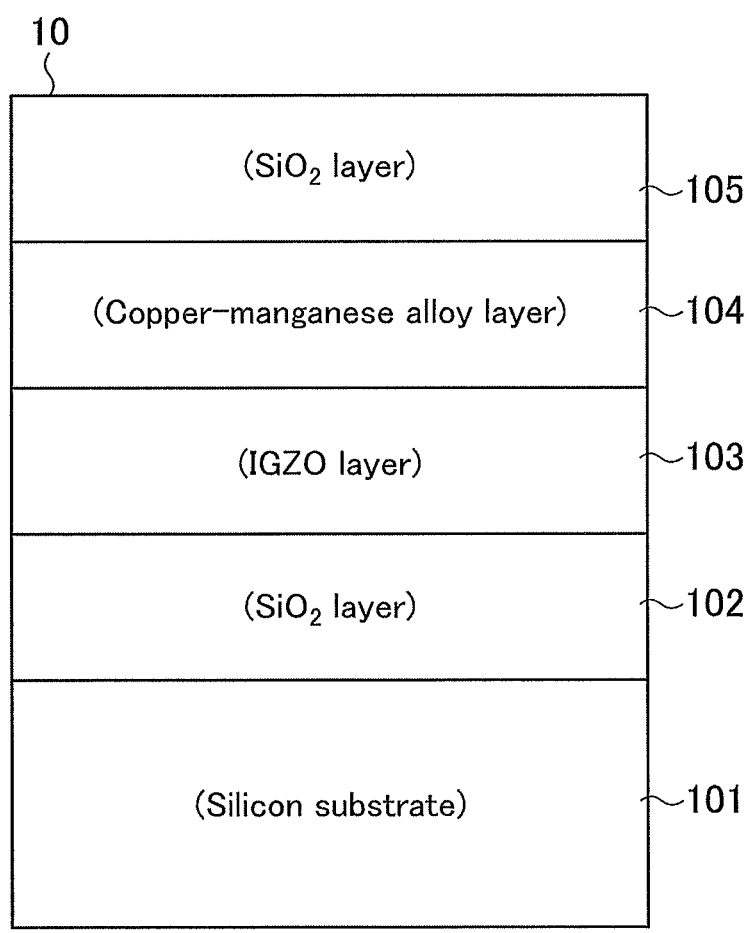
FIG. 1 is a schematic sectional view of a multilayer structure of a first embodiment prior to heat treatment.

EXPLANATION OF REFERENCE SYMBOLS 10 multilayer structure
101 silicon substrate
102 silicon dioxide layer ($SiO_2$)
103 indium-gallium-zinc (IGZO) oxide semiconductor layer
104 copper-manganese alloy layer
105 silicon dioxide layer ($SiO_2$)
106 intermediate layer
106a first region of intermediate layer
106b second region of intermediate layer
107 copper layer, electrode body, formed of copper-manganese alloy layer
108 pure copper layer
203 indium-gallium-zinc oxide semiconductor layer, IGZO layer
206 intermediate layer
206a first region of intermediate layer
206b second region of intermediate layer
207 titanium layer

BEST MODE FOR CARRYING OUT THE INVENTION

In the present invention, an ohmic electrode is formed on an oxide semiconductor composed of an electrically conductive oxide semiconductor material. Examples of the oxide semiconductor layer provided with the ohmic electrode include layers (indium-containing oxide layers) composed of zinc oxide (ZnO), indium-tin composite oxide, or other such oxide containing indium (element symbol: In). In the present invention, the ohmic electrode is in particular located on a layer of indium-gallium-zinc complex oxide (where the chemical composition formula is $In\alpha Ga\beta Zn\gamma O\delta$: $\alpha$, $\beta$, $\gamma$ and $\delta$ indicate composition, and $\alpha > 0$, $\beta \geq 0$, $\gamma \geq 0$, and $\delta > 0$.

In the present invention, a configuration is defined to provide an ohmic electrode on an indium-containing oxide semiconductor layer so as to sandwich an intermediate layer composed of a first and second regions. Preferably, the first region of the intermediate layer is, so to speak, an indium-rich region in which indium is made present at high concentration. The indium-concentrated region is defined to be one that contains more indium than an interior of the indium-containing oxide.

The intermediate layer is best given a configuration that places the indium-concentrated first region in contact with the indium-rich oxide semiconductor layer and places the second region in contact with the ohmic electrode. As the indium-concentrated first region acts as a high-conductivity layer, it is possible by arranging the first and second regions in this way to contribute to realize an ohmic electrode of low electrical contact resistance.

Now, in order to inhibit intrusion into the ohmic electrode of elements constituting the indium-containing oxide semiconductor layer, particularly indium, the second region of the intermediate layer is made a region lower in atomic concentration of indium than the first region. If the indium concentration inside the second region is reduced, the effect of reducing the amount of indium entering the ohmic electrode is enhanced, whereby it is possible to help realize an ohmic electrode low in impurities and low in electrical resistance. For example, an ohmic electrode composed of copper containing almost no indium can be furnished.

If the second region is constituted of an oxide containing as its main element a metal whose standard free energy of formation of oxide (free energy of oxide formation) is of lower value than that of indium, the metal reduces the indium-containing oxide semiconductor layer to become a metallic oxide, so that indium can be rich in the first region in the course of the metallic oxide formation. Simultaneously, the first region increases carrier density owing to formation of more oxygen vacancies than in the indium-containing oxide. Therefore, the electrical conductivity of the first region improves to help reducing the interfacial contact resistance with the ohmic electrode. In addition, interfacial adhesion between the ohmic electrode and the indium-containing oxide semiconductor can be improved as a result of a occurrence of an interfacial reaction. Here, the fact that the value of the free energy of oxide formation is negative and the free energy of oxide formation is low indicates that the absolute value is high and stability as an oxide is high.

In addition, when the second region is constituted of an oxide containing as its main element a metal having a lower value of free energy of oxide formation than indium, an oxide more stable oxide than the indium-containing oxide can be formed. Therefore, elements constituting the indium-containing oxide cannot diffusively infiltrate the metallic oxide formed in the second region, so that diffusion of elements constituting the indium-containing oxide into the ohmic electrode can also be prevented. As a result, the resistance of the electrode material can be prevented from increasing unnecessarily.

According to an Ellingham diagram (see, for example, Metallurgical Thermodynamics of Iron, Masayoshi OHTANI, Nikkan Kogyo Shimbun, p 103), metals having a lower value of free energy of oxide formation than indium include manganese (Mn), molybdenum (Mo), vanadium (V), tantalum (Ta), titanium (Ti), cerium (Ce), aluminum (Al), magnesium (Mg), lithium (Li), calcium (Ca) and so on. Among these metals, manganese (Mn), molybdenum (Mo), vanadium (V) and titanium (Ti) are especially preferable. Mn, Mo, V and Ti are all transition metals and can take multiple valence states. The charge distribution of the regions as a whole can therefore be maintained in the most stable state by appropriately varying the valences in the first region and the second region. As a result, the first region and the second region can both assume a stable state both electrically and thermally, so that long-term reliability can be ensured for both the ohmic characteristics and the adhesion properties.

And even among these transition metals, Mn is particularly preferable. Mn tends to form a solid solution with the Cu that is the main constituent element of the ohmic electrode present adjacently. Therefore, when an oxide containing Mn is formed in the second region, there is the advantage of being able to obtain excellent adhesion with respect to the ohmic electrode.

Like Mn, Ti is also preferable. Ti tends to form an intermetallic compound with the Cu that is the main constituent element of the ohmic electrode present adjacently. Therefore, when an oxide containing Ti is formed in the second region, there is the advantage of being able to obtain excellent adhesion with respect to the ohmic electrode.

When the first and second regions contain Mn, it is advantageous to make the manganese present so as to increase the valence (electrovalence) of the manganese from the portion of the second region in contact with the ohmic electrode toward the portion of the first region in contact with the indium-containing oxide semiconductor layer. According to an Ellingham diagram, Mn oxide decreases in free energy of oxide formation to become stably present in proportion as the valence of the Mn is lower. Therefore, mutual diffusion between the ohmic electrode and the indium-containing oxide semiconductor can be prevented by forming the second region of structurally stable Mn oxide. Further, in the first region, it is possible by increasing the valence of the Mn to correct disturbances in the charge distribution of the region reduced and increased in oxygen vacancies, and to establish an electrically stable structure.

With Ti, as with Mn, when the first and second regions contain Ti, it is advantageous to make the Ti present so as to increase the valence of the Ti from the portion of the second region in contact with the ohmic electrode toward the portion of the first region in contact with the indium-containing oxide semiconductor layer. According to the Ellingham diagram, a Ti oxide decreases free energy of oxide formation to become stably present in proportion as the valence of the Ti is lower. Therefore, mutual diffusion between the ohmic electrode and the indium-containing oxide semiconductor can be prevented by forming the second region of structurally stable Ti oxide. Further, in the first region, it is possible by increasing the valence of the Ti to correct disturbances in the charge distribution of the region reduced and increased in oxygen vacancies, and to establish an electrically stable structure.

It is best to constitute the second region of the intermediate layer from an amorphous layer. Elements constituting the oxide semiconductor layer diffuse and move along grain boundaries at high speed. As an amorphous layer has no grain boundaries, it is possible by constituting the second region from an amorphous layer to inhibit diffusive intrusion into the ohmic electrode of indium and other elements constituting the indium-containing oxide semiconductor layer, whereby it is possible to contribute to realize an ohmic electrode of low electrical resistance.

As constituting the first region of the intermediate layer from crystal grains containing indium forms a high conductivity portion, it has the effect of reducing the electrical resistance of the intermediate layer and lowering the interfacial contact resistance between the ohmic electrode and the indium-containing oxide semiconductor layer. It is therefore suitable in providing, for example, a thin-film transistor or the like that utilizes as the active layer an oxide semiconductor layer of high electron mobility that provides high-speed operation. The crystal grains containing indium here are nearly spherical or other such crystal grains composed of indium. Or they are crystal grains composed of an oxide containing indium.

The thicknesses of the first and second regions forming the intermediate layer are substantially equal, and the thickness of the intermediate layer of the combined first and second regions is preferably 3 nm or greater and 30 nm or less. In the intermediate layer, should the indium-rich first region be much thicker than the second region, the first region of high conductivity owing to the rich indium would account for a greater proportion of the intermediate layer, so that a resulting electrode excellent in ohmic properties would be expected. In this case, however, the amount of indium and the like contained in the first region that infiltrates into the interior of the electrode would increase as a result of the second region becoming thinner, so that formation of an electrode excellent in ohmic properties might sometimes be impeded. Since opportunities for mutual dispersion increase, the overall intermediate layer thickness that is the sum of the individual thicknesses of the first and second regions needs to be at least 3 nm. On the other hand, even if the respective thicknesses of the first and second regions are made equal, expanding the overall intermediate layer thickness to greater than 30 nm increases the electrical resistance of the intermediate layer, so that an electrode excellent in ohmic properties is not realized. Therefore, the thickness of the intermediate layer is preferably 30 nm or less.

Formation on the indium-containing oxide semiconductor layer of an indium-rich first region containing indium at a higher indium concentration than that of the indium-containing oxide semiconductor layer is performed by, for example, forming an oxide gallium-indium-zinc (abbreviation: IGZO) semiconductor layer by the high-frequency sputtering method, and then forming the first region by simultaneous sputtering using an indium oxide (chemical composition formula $In_2O_3$) or other oxide target that makes the indium content ratio higher than that of IGZO and a target composed of, for example, manganese. In the case of formation by the high-frequency sputtering method, the thickness of the first region is regulated by the length of the sputtering time under the deposition conditions that determine the predetermined deposition rate. Following this, the second region containing manganese or other metal is formed on the first region by an ordinary vacuum deposition method, electron beam deposition method, high-frequency sputtering method or the like. If the thickness of the second region is made the same as that of the first region, an intermediate layer composed of first and second regions of the same thickness can be formed.

Further, as another method of forming the indium-concentrated first region on the IGZO semiconductor layer, a method of adding metallic indium is available. For example, at the time of forming a manganese oxide film by the high-frequency sputtering method, metallic indium doping is performed concurrently to form the first region. Next, a layer of lower free energy of oxide formation than indium, e.g., of an oxide of manganese ($Mn_xO_y$: $x>0$, $y>0$), is formed on the first region as the second region. If the thicknesses of the first and second regions are made the same, the intermediate layer can be advantageously formed.

In the present invention, the ohmic electrode is formed from copper, which is lower in electrical resistance than aluminum. An ohmic electrode composed of copper (sometimes abbreviated to copper ohmic electrode) can be formed by using pure copper or a copper alloy containing a metal element as an additive element as starting material. The copper alloy for forming the copper ohmic electrode is desirably added with a transition metal low in free energy of oxide formation that can assume multiple different valences. These are, for example, manganese (element symbol: Mn), molybdenum (Mo), vanadium (V), tantalum (Ta), titanium (Ti), and cerium (Ce). A copper alloy that, among these, uses Mn or Ti as the additive element is particularly preferable as the starting material.

In order to reduce interconnection resistance and realize good ohmic contact, it is possible to deposit a film of Mn or Ti on the surface of the IGZO semiconductor layer and thereafter complete the electrode by depositing a pure Cu film. In this case, the Mn or Ti directly contacts the IGZO semiconductor layer, so that the same effect as above can be realized by heat treatment at a low temperature for a short time.

In addition, with the aim of reducing interconnection resistance, it is possible to deposit a film of Cu—Mn alloy or Cu—Ti alloy on the surface of the IGZO semiconductor layer and thereafter complete the electrode by depositing a pure Cu film.

After the copper alloy film containing these additive elements has been deposited on the oxide semiconductor layer, if heat treatment is performed on the copper alloy, an oxide of the additive element can be formed at the bonding interface between the oxide semiconductor layer and the copper alloy film. This is because the heat treatment diffuses the additive element toward the oxide semiconductor layer, and the additive element of lower free energy of oxide formation than the copper preferentially combines with the oxygen that is a constituent of the oxide semiconductor layer. The layer composed of the oxide of this additive element can be advantageously utilized to constitute the second region. Concomitantly, the region of the oxide semiconductor reduced by the additive element becomes oxygen deficient, thereby increasing carrier density to become a first region having high electrical conductivity. In addition, the interior of the copper alloy from which the additive element has escaped comes to consist almost entirely of pure copper, so that an ohmic electrode can be favorably formed from copper of low electrical resistance.

Thus, the additive element can be driven out of the copper alloy by the heat treatment, but to what degree strongly depends on the heat treatment conditions. Depending on the conditions, the additive element may in some cases persist in the copper alloy and in other cases be totally driven out of the copper alloy to make the interior pure copper. In the present invention, both states are called "copper alloy." For example, in the case of a Cu—Mn alloy, the state is termed with reference to the pre-heat-treated state as "Cu—Mn alloy" or "copper-manganese alloy" irrespective of the internal Mn concentration after heat treatment.

In particular, when a copper-manganese alloy containing manganese as the additive element at an atomic concentration of a ratio of 1 atomic % to 10 atomic % is used as the starting material, a barrier layer that contains concentrated manganese of the alloy to be served as a second region can be spontaneously formed. This barrier layer acts as a diffusion barrier for preventing oxygen contained inside the oxide semiconductor layer from penetrating the copper of the electrode. Owing to this effect, the copper of the electrode avoids oxidation, so that an ohmic electrode can be constituted from pure copper of low electrical resistance.

After the copper-manganese alloy has been deposited on the oxide semiconductor layer, the heating temperature for simultaneously forming the indium-rich first region and the manganese-containing second region using the copper-manganese alloy as starting material is 100° C. or more 450° C. or less, and the heating time is 5 min or more to 90 min or less. The time period of the heating should be shortened in proportion as the temperature is higher.

First Embodiment

The detail of the present invention will be explained taking as an example case of formation on a conductive n-type indium-containing oxide semiconductor layer that uses copper-manganese as the electrode material. FIG. 1 is a schematic sectional view of the multilayer structure of the first embodiment prior to heat treatment. A 50 nm thick silicon dioxide ($SiO_2$) insulation layer 102 was formed on a silicon substrate 101 using tetraethoxy silicon (abbreviation: TEOS) as starting material. An oxide semiconductor layer (IGZO layer) 103 composed of n-type amorphous indium-gallium-zinc oxide (a-$InGaZnO_4$) was deposited on the $SiO_2$ insulation layer 102 to a thickness of 30 nm by the ordinary high-frequency sputtering method. The IGZO layer 103 was deposited in a mixed atmosphere of argon and oxygen whose volume percentage of oxygen was 5%, at a pressure of 0.1 pascal (pressure unit: Pa). Next, a copper-manganese alloy layer 104 was deposited on the surface of the IGZO layer 103 by the ordinary high-frequency sputtering method using as the target material a copper-manganese alloy containing manganese at an atomic concentration of 4%. The thickness of the copper-manganese alloy layer 104 was made 100 nm. In addition, a $SiO_2$ layer 105 was formed to a thickness of 200 nm as an anti-oxidation film by the ordinary high-frequency sputtering method. This completed the formation of a multilayer structure 10. The atomic concentration of the manganese inside the deposited copper-manganese alloy layer 104 was estimated to be substantially the same as the atomic concentration of the manganese of the target material.

Figure 2:
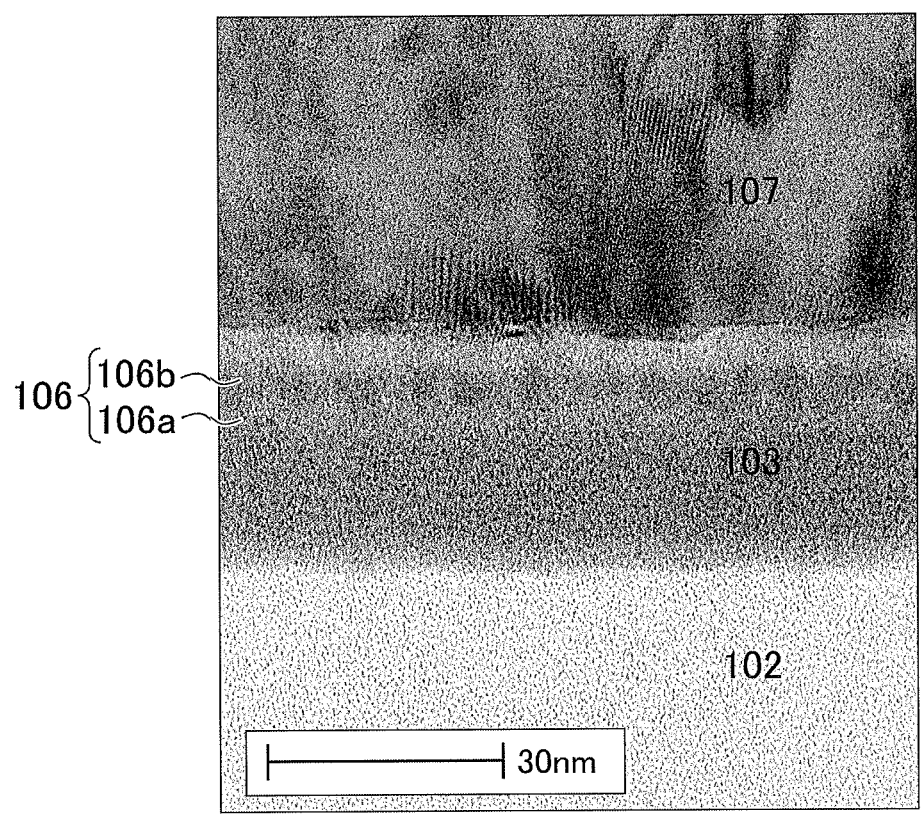
FIG. 2 is a cross-sectional TEM image of an interface vicinity after heat treatment in the first embodiment.

Next, the multilayer structure 10 was heated at 250° C. for 60 min in the atmosphere. Owing to this heating, the manganese inside the copper-manganese alloy layer 104 diffused and moved to the IGZO layer 103 side. The copper-manganese alloy layer 104 therefore became a layer (electrode body) 107 composed substantially of pure copper. The multilayer structure was left to cool in the aforesaid atmosphere, whereafter a cross-sectional TEM image of the interface region between the electrode body 107 and the IGZO layer 103 was taken. The cross-sectional TEM image is shown in FIG. 2. The IGZO layer 103 and two regions 106a, 106b differing in contrast were observed to be present. The first region 106a was observed as a granularly distributed structure adjacent to the IGZO layer 103. The high-resolution TEM image obtained from this portion exhibited a periodic lattice pattern, confirming that it was crystalline. The second region 106b was observed as a layer adjacent to the electrode body 107 (ohmic electrode) that had continuous weak contrast. The contrast did not change when the specimen was rotated and no periodic lattice pattern was observed in the high-resolution TEM image, demonstrating that the second region 106b was amorphous. In addition, the thicknesses of the first region 106a and second region 106b were substantially the same, and the thickness of the intermediate layer 106 composed of the first region 106a and second region 106b was 6 nm.

Figure 3:
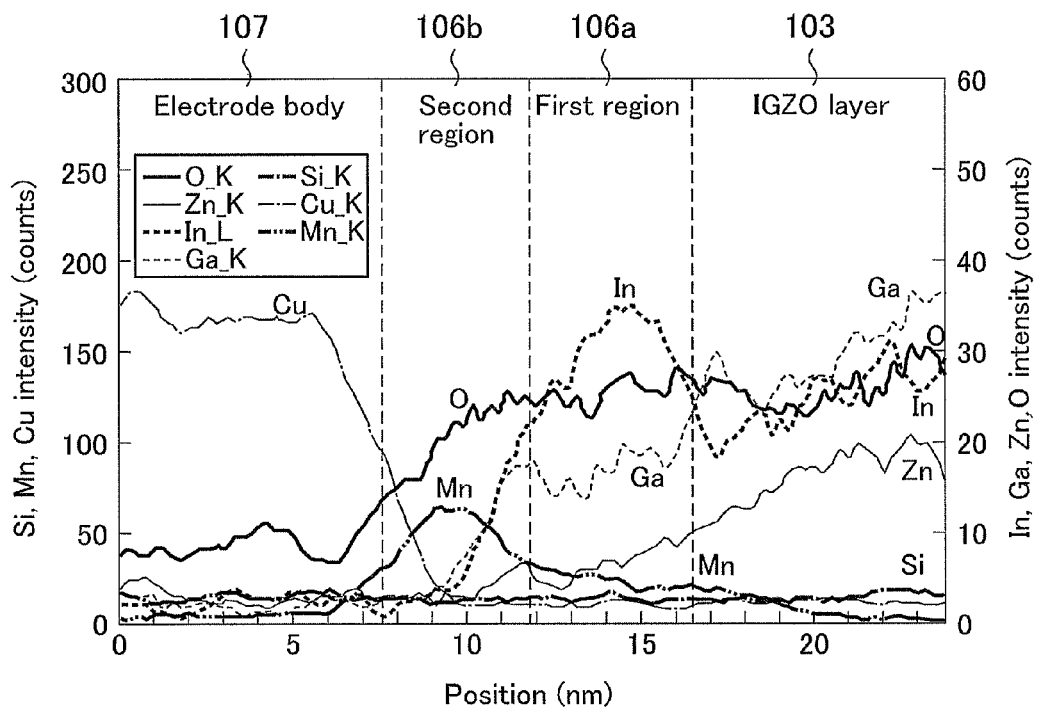
FIG. 3 is diagram showing an energy intensity dispersion of elements in the interface vicinity after heat treatment in the first embodiment as determined using an X-ray energy dispersive spectrometer (EDS).

Analysis by EDX (Energy-Dispersive X-ray microanalysis) was performed along the direction perpendicular to the layer interface (intermediate layer 106) shown in FIG. 2, and the results obtained for the distributions of the X-ray intensities emitted by the respective constituent elements are shown in FIG. 3. The X-ray intensity distributions correspond to the concentration distributions of the respective elements, making it possible to ascertain the relative changes among the element concentrations with position. The first region 106a in contact with the IGZO layer 103 is shown to be a region abundantly containing elements constituting the IGZO layer 103, particularly indium. The atomic concentration of indium inside the first region 106a (about 35 as X-ray intensity) was about 1.4 times as high as the atomic concentration of indium inside the IGZO layer 103 (about 25 as X-ray intensity). Further, as shown in FIG. 3, the interior of the first region 106a contained oxygen, and the atomic concentration thereof was lower than the atomic concentration of oxygen inside the IGZO layer 103. Therefore, the first region 106a was judged to be an indium-rich oxide layer.

Further, the second region 106b present in contact with the electrode body 107 was, from the results of FIG. 3, a layer containing manganese as the main constituent element. The atomic concentration inside the second region 106b of indium and other elements constituting the IGZO layer 103 was low in comparison with the first region 106a, but copper was contained at higher concentration than in the first region 106a. In other words, the second region 106b had a preferable structural configuration as a barrier layer for preventing mutual diffusion of copper that was the main constituent element of the electrode body 107 and the IGZO layer 103. The second region 106b had a thickness of a few nm and was a thin layer of the same thickness as the first region 106a.

Figure 4:
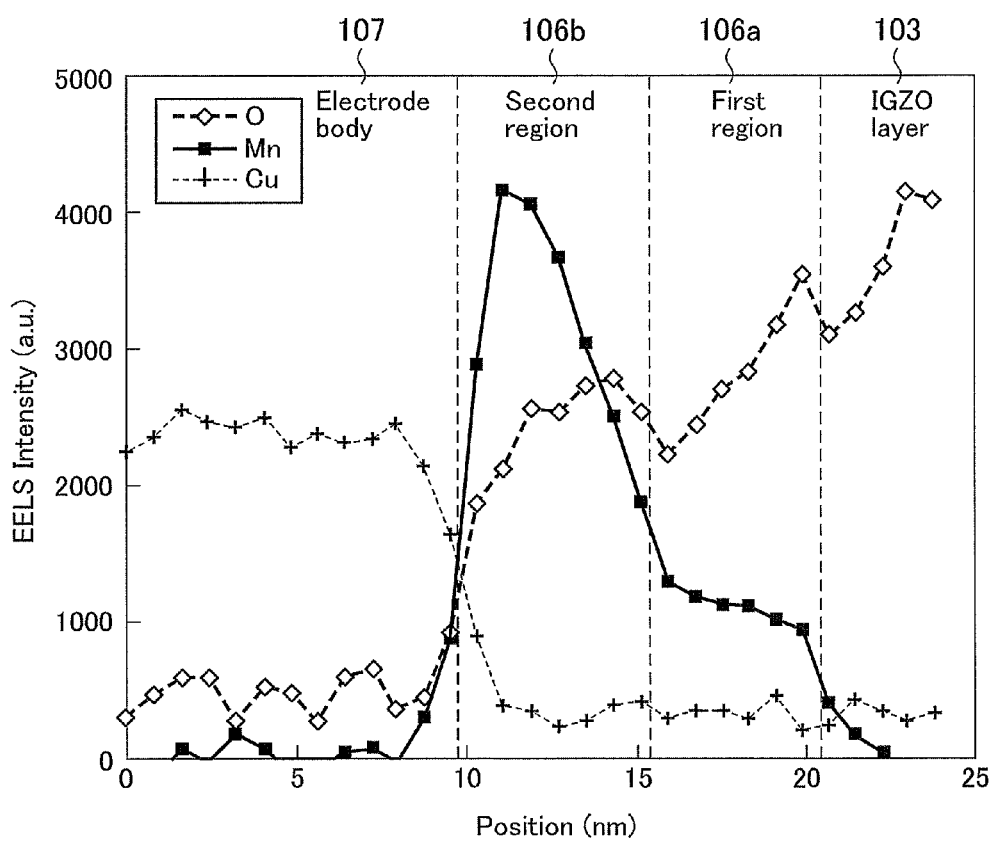
FIG. 4 is a diagram showing the energy intensity dispersion of elements in the interface vicinity after heat treatment in the first embodiment as determined using an electron energy loss spectrometer (EELS).

The results of analysis by EELS (Electron Energy-Loss Spectrocopy) along the direction perpendicular to the layer interface (intermediate layer 106) of FIG. 2 are shown in FIG. 4. FIG. 4 is a diagram showing the observed intensities of copper (Cu), manganese (Mn) and oxygen (O) obtained by the ELLS method. Starting from the left are shown the electrode body 107, second region 106b, first region 106a, and IGZO layer 103. As a result of the heat treatment, Mn concentration in the electrode body 107 is so low as to be negligible. Further, Mn concentration is highest in the second region 106b. The first region 106a showed flat Mn intensity distribution, suggesting formation of a Mn-containing equilibrium layer. Further, oxygen intensity is weaker in the first and second regions 106a, 106b than inside the IGZO layer 103. Considered in terms of oxygen concentration, this indicates that oxygen concentration is lower in the first and second regions 106a, 106b than inside the IGZO layer 103 and that oxygen vacancies occurred in the first region 106a together with Mn reduced the IGZO layer 103 to form Mn oxide in the intermediate layer 106.

Figure 5:
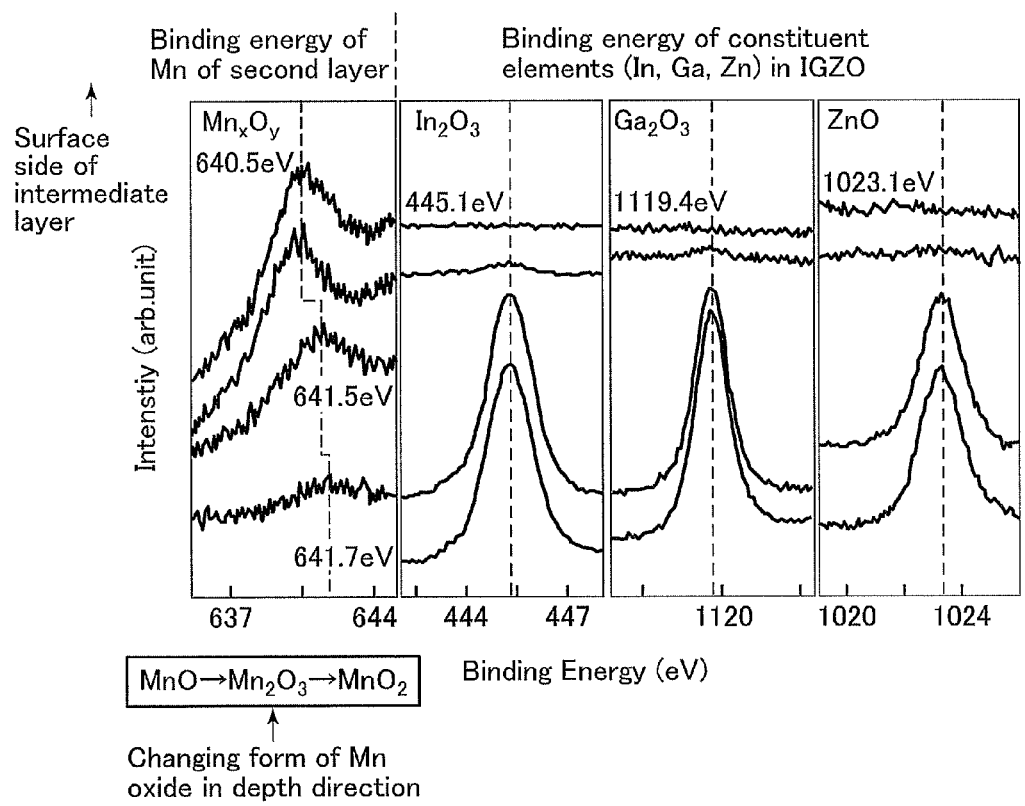
FIG. 5 is a diagram showing a binding energy of elements in an interior of an intermediate layer after heat treatment of the first embodiment.

The chemical state of presence of the manganese contained in the second region 106b was identified by the X-ray photoelectron spectroscopy method (abbreviation: XPS) method. FIG. 5 shows the binding energy between the manganese of the second region 106b and the oxides of the indium, gallium and zinc of the IGZO layer 103. Manganese contained in the second region 106b was present in the state of oxide ($Mn_xO_y$: $0<x$, $0<y$), and the binding energy of manganese near the surface of the second region 106b was measured to be 640.5 electron volts (energy unit: eV). The binding energy of manganese at the center of the second region 106b was 641.5 eV and gradually increased to 641.7 eV on the first region 106a side. From this it was learned that going from the second region 106b toward the first region 106a manganese was present in chemical states that changed from manganese oxide (MnO) through manganese trioxide ($Mn_2O_3$) to manganese dioxide ($MnO_2$). In other words, going from the second region 106b toward the first region 106a, manganese was present with valance (electrovalence) increasing from 2 (in the case of MnO) to 4 (in the case of $MnO_2$).

On the other hand, in the region from the intermediate layer 106 across the IGZO layer 103, the bonding energies of indium, gallium and zinc were 445.1 eV, 1119.4 eV and 1023.1 eV, respectively. From this it was judged that indium, gallium and zinc were respectively present in the combined forms of indium trioxide ($In_2O_3$), gallium trioxide ($Ga_2O_3$) and zinc oxide (ZnO). Further, in contrast with the case of manganese, no change was observed in the bonding energies of indium, gallium and zinc from the intermediate layer 106 across the IGZO layer 103. In other words, no change was brought about in the indium, gallium and zinc valances in the depth direction.

Figure 6:
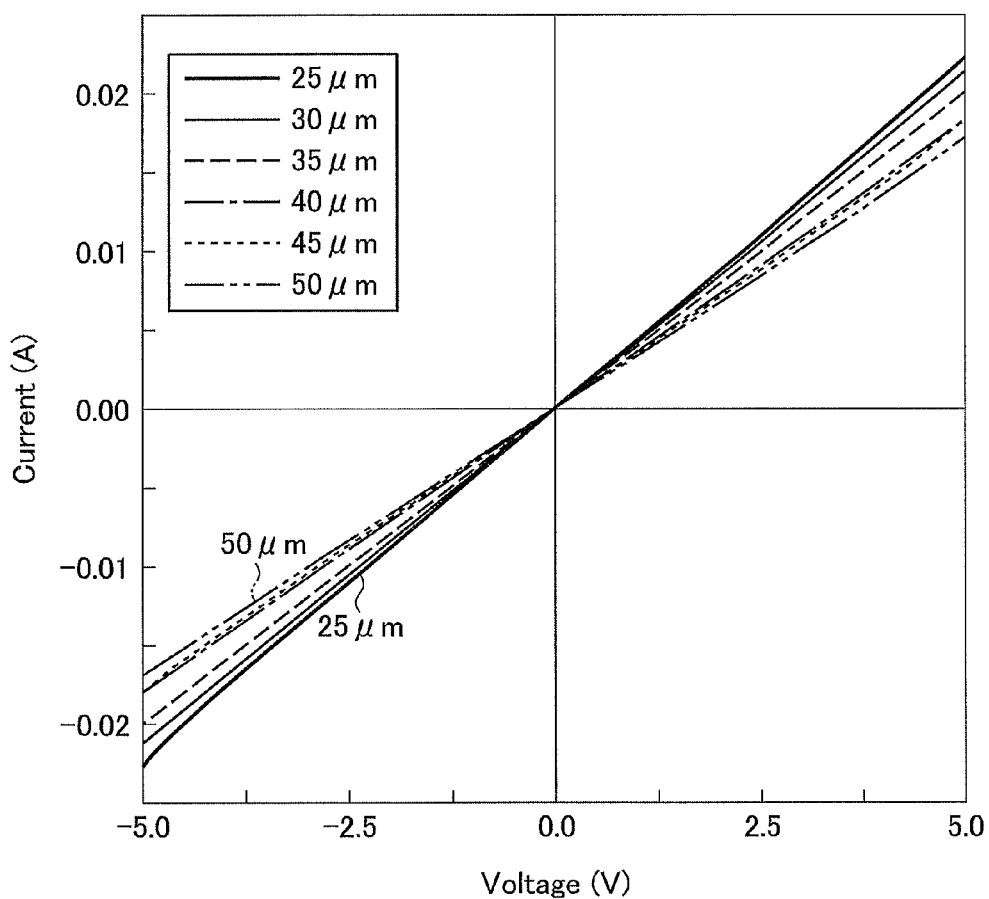
FIG. 6 is a diagram showing current-voltage characteristics in an electrode structure obtained in the first embodiment.

With respect to the electrode body 107 that came to be formed of nearly pure copper owing to the diffusion by the aforesaid heating of manganese that helped to form the second region 106b, rectangular electrodes were fabricated to a width of 120 micrometers (length unit: μm) and length (length in the direction parallel to current flow direction) of 60 μm and direct current was then passed between opposing electrodes. The current (I)-voltage (V) characteristics in this case are shown in FIG. 6. The numerals in the drawing are distances between the electrodes in the measurement. In the case of using copper-manganese alloy as the starting material, the results obtained exhibited good ohmic characteristics of linear current increase relative to voltage from low applied voltage. In addition, electrical contact resistance was measured by the TLM (Transmission Line Mode) method. The contact resistance at room temperature of ohmic electrodes formed by using a copper alloy containing manganese at the rate of 4% in terms of atomic concentration was calculated to be 1.2 to $29 \times 10^{-4} \Omega \cdot cm^2$. Moreover, the mobility of the amorphous IGZO layer after forming the copper ohmic electrodes was maintained high, at about 7 to 8 $cm^2/V \cdot s$.

When, in order to investigate adhesion, Scotch Tape was attached to and peeled off the copper film surface, nothing adhered to the attached surface of the tape and no film detachment occurred. From this, it was clear that adhesion between the copper-manganese alloy (electrode body 107) and the IGZO layer 103 is excellent.

As the electrode structure, it is possible to use one obtained by adhering a copper/manganese two-layer film or a copper/copper-manganese alloy two-layer film to the IGZO layer and applying heat treatment. These also make it possible to obtain the same results as one obtained by applying heat treatment to the aforesaid copper-manganese alloy/IGZO layer.

Comparative Example

Figure 7:
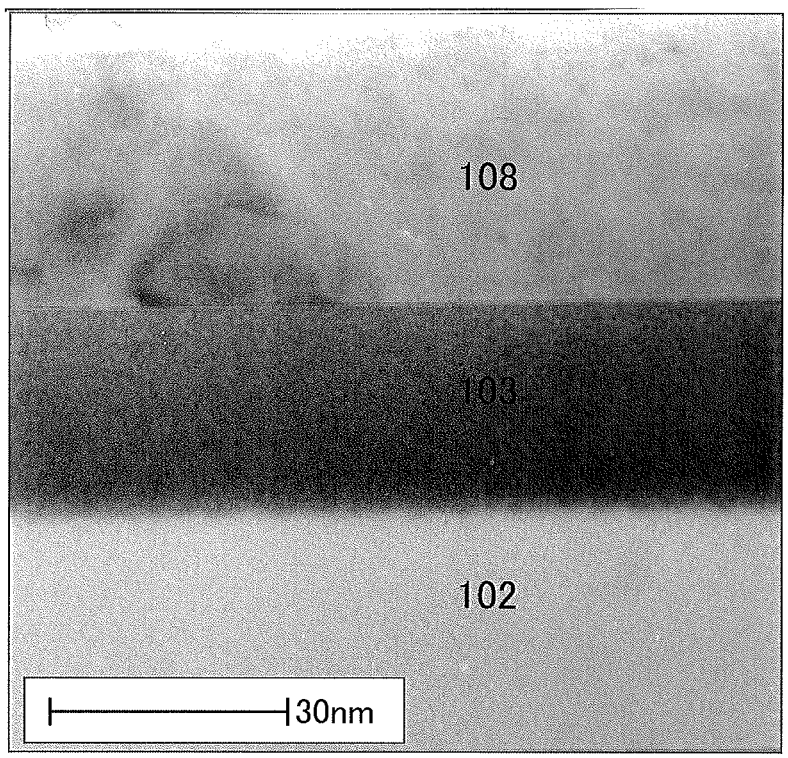
FIG. 7 is a sectional TEM image of an interface vicinity after heat treatment in a comparative example.
Figure 8:
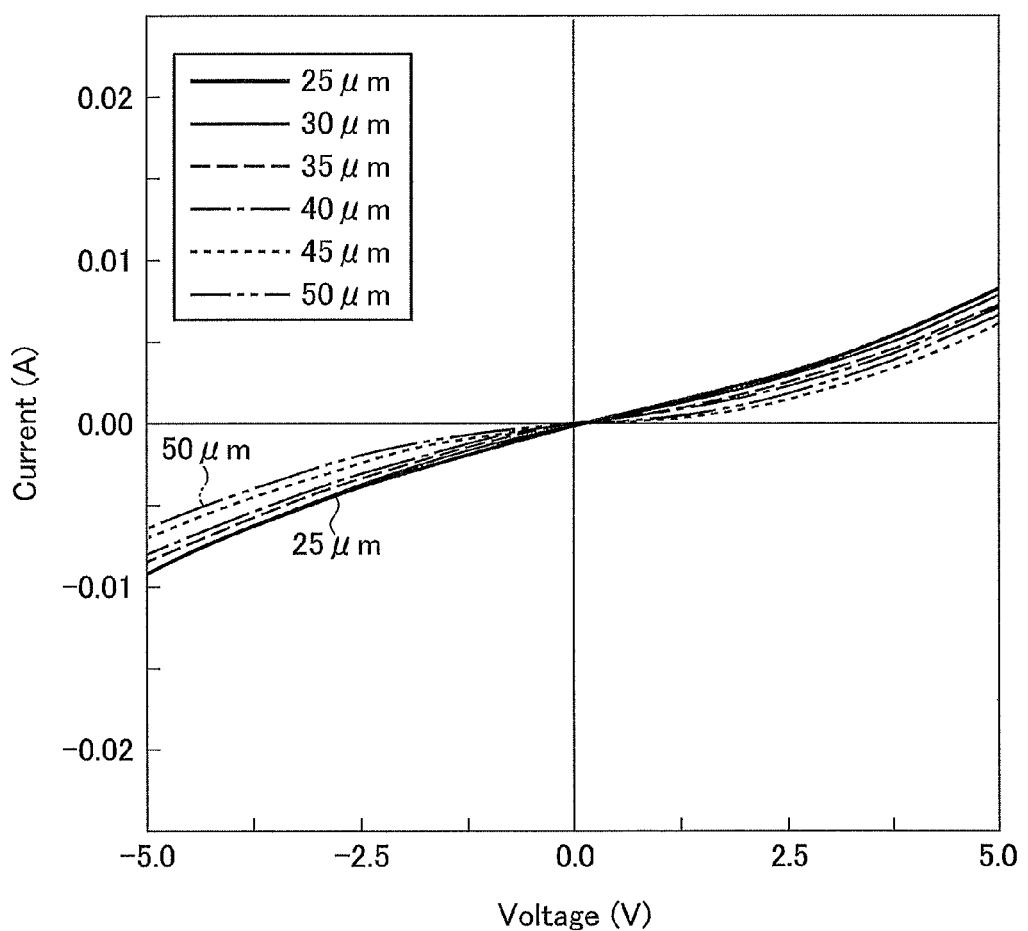
FIG. 8 is a diagram showing current-voltage characteristics in an electrode structure obtained in the comparative example.

The copper-manganese alloy of the first embodiment was replaced with pure copper (99.9999% purity) and a test was performed under the same conditions. The results observed by cross-sectional TEM of the interface vicinity of the copper (108) and the IGZO (103) are shown in FIG. 7. Even though heat treatment was conducted at 250° C. for 1 h, formation of an intermediate layer by an interfacial reaction was not confirmed. Further, when, in order to investigate adhesion, Scotch Tape was attached to and peeled off the copper thin film surface, copper then film adhered to the attached surface of the Scotch Tape, revealing that adhesion between the copper and IGZO was deficient. Further, the results when an electrode array was formed and current-voltage was measured between electrodes are shown in FIG. 8. It is indicated that non-linear relationships were obtained, the slopes were moderate compared with those for the copper-manganese alloy shown in FIG. 5, and the interfacial contact resistance was high.

Second Embodiment

Figure 9:
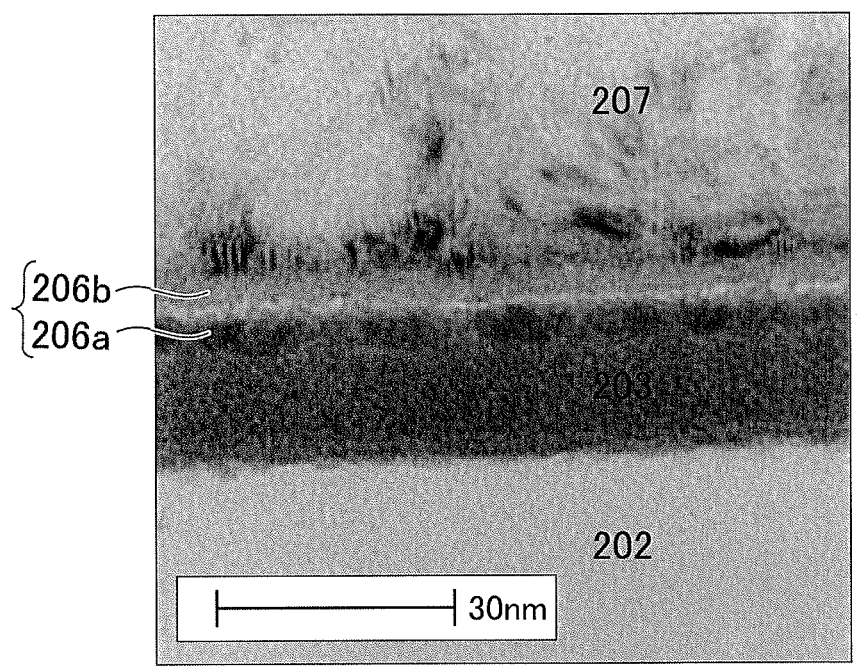
FIG. 9 is a sectional TEM image of an interface vicinity after heat treatment in a second embodiment.

The copper-manganese alloy in the embodiment set out above was changed to titanium and a test was performed under the same conditions. The results observed by TEM of the interface vicinity of the titanium and the IGZO are shown in FIG. 9. As heat treatment was conducted at 250° C. for 1 h, the Ti layer 207 and IGZO layer 203 reacted to form an intermediate layer 206. Similarly to the case of the copper-manganese alloy, this intermediate layer 206 was composed of a first region 206a and a second region 206b. It can be seen that the first region 206a was composed of fine crystal grains and the second region 206b was composed of amorphous material exhibiting uniform contrast.

Figure 10:
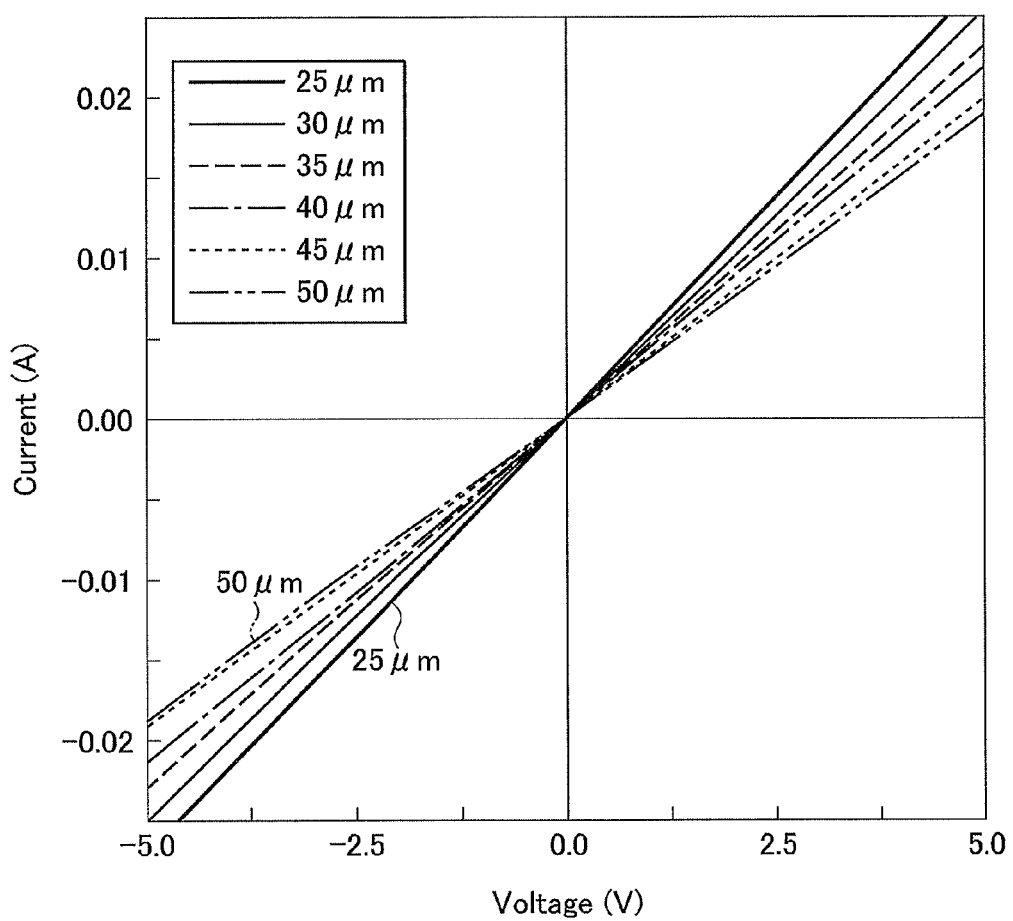
FIG. 10 is a diagram showing current-voltage characteristics in the electrode structure obtained in the second embodiment.

A titanium electrode array was formed by using the lift-off method and the current-voltage relationship between electrodes was measured. The results are shown in FIG. 10. The numerals in the drawing indicate the distances between the electrodes used in the measurement. Distinct linear relationships were obtained at every electrode spacing, and the interface can be seen to be ohmic contact. Electrical contact resistance was determined by the TLM method and found to be 0.2 to $1.5 \times 10^{-4} \Omega \cdot cm^2$, indicating performance on a par with copper-manganese.

Like results can also be achieved using a copper/titanium two-layer film, copper-titanium alloy film, or a copper/copper-titanium two-layer film as the electrode material structure.

Industrial Applicability

The ohmic electrode composed of copper of the present invention can be used as, for example, the source or drain electrode of a thin-film transistor with an active layer of indium-containing oxide semiconductor. The layer is formed from n-type gallium-indium-zinc oxide or the like. For example, it is formed of n-type. In particular, it can be favorably formed from gallium-indium-zinc composite oxide, which has a high electron mobility about ten times higher than that of the amorphous silicon (electron mobility of about 0.3 to about 1.0 $cm^2/V \cdot s$) that is the conventional active layer material.

Further, in the semiconductor device known as a light-emitting diode (abbreviation: LED), for example, it can be used as an n-type or p-type ohmic electrode provided at the so-called window layer composed of optically transparent oxide semiconductor for efficiently transmitting emitted light to the exterior. For example, it can be used as an ohmic electrode provided at the window composed of indium-tin (element symbol: Sn) composite oxide or indium-zinc (element symbol: Zn) composite oxide used in a pn junction double heterostructure (abbreviation: DH) LED with a light-emitting layer of gallium-indium-nitride (GaxInyN: $0 \leq x, y \leq 1, x+y=1$).

The invention claimed is:

1. A semiconductor device comprising:
   a semiconductor layer composed of an oxide semiconductor material containing indium;
   an ohmic electrode provided on the semiconductor layer and having an ohmic contact with the semiconductor layer; and
   an intermediate layer provided between the semiconductor layer and the ohmic electrode,
   wherein the intermediate layer includes a first region whose indium atomic concentration is greater than that of an interior of the semiconductor layer and a second region whose indium atomic concentration is less than that of the first region,
   the first and second regions are constituted to contain an oxide of a metal forming the ohmic electrode,
   the metal forming the ohmic electrode contains manganese (Mn), and
   an atomic concentration of the manganese is lower in the first region than in the second region.

2. The semiconductor device as recited in claim 1, wherein the first region is located in contact with the semiconductor layer and the second region is located in contact with the ohmic electrode.

3. The semiconductor device as recited in claim 1, wherein the first region is composed of crystal grains containing indium (In).

4. The semiconductor device as recited in claim 1, wherein the second region is composed of amorphous material.

5. The semiconductor device as recited in claim 1, wherein the thickness of the intermediate layer where the first region and the second region meet is 3 nm or more and 30 nm or less.

6. The semiconductor device as recited in claim 1, wherein an electrovalence of the manganese increases from the second region toward the first region.

7. The semiconductor device as recited in any claim 1, wherein oxygen concentrations of the first and second regions are lower than an oxygen concentration of the semiconductor layer.

8. The semiconductor device recited in claim 1, wherein the ohmic electrode is formed of a copper alloy whose main constituent element is copper.

9. The semiconductor device as recited in claim 8, wherein the second region contains more copper than the first region.

10. The semiconductor device as recited in claim 2, wherein the first region is composed of crystal grains containing indium (In).

11. A semiconductor device comprising:

a semiconductor layer composed of an oxide semiconductor material containing indium;

an ohmic electrode provided on the semiconductor layer and having an ohmic contact with the semiconductor layer; and an intermediate layer provided between the semiconductor layer and the ohmic electrode, wherein the intermediate layer includes a first region whose indium atomic concentration is greater than that of an interior of the semiconductor layer and a second region whose indium atomic concentration is less than that of the first region, the first and second regions are constituted to contain an oxide of a metal forming the ohmic electrode, the metal forming the ohmic electrode contains manganese (Mn), and an electrovalence of the manganese increases from the second region toward the first region.

* * * * *